(12) United States Patent
Fulkerson

(10) Patent No.: US 7,236,001 B2
(45) Date of Patent: Jun. 26, 2007

(54) REDUNDANCY CIRCUITS HARDENED AGAINST SINGLE EVENT UPSETS

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 144 days.

(21) Appl. No.: 11/219,369

(22) Filed: Sep. 2, 2005

(65) Prior Publication Data

US 2007/0052442 A1 Mar. 8, 2007

(51) Int. Cl.
*H03K 19/03* (2006.01)

(52) U.S. Cl. ............................. 326/12; 326/14
(58) Field of Classification Search ............. 326/9, 326/10, 12, 14
See application file for complete search history.

(56) References Cited

U.S. PATENT DOCUMENTS

| | | | | |
|---|---|---|---|---|
| 4,189,785 A | 2/1980 | Rapp | ............................ | 365/156 |
| 4,782,467 A | 11/1988 | Belt et al. | ..................... | 365/154 |
| 4,805,148 A | 2/1989 | Diehl-Nagle et al. | ........ | 365/154 |
| 5,175,605 A | 12/1992 | Pavlu et al. | .................. | 257/369 |
| 5,220,192 A | 6/1993 | Owens et al. | ................ | 257/519 |
| 5,311,070 A | 5/1994 | Dooley | | |
| 5,406,513 A | 4/1995 | Canaris et al. | ............... | 365/181 |
| 5,631,863 A | 5/1997 | Fechner et al. | .............. | 365/156 |
| 5,644,266 A | 7/1997 | Chen et al. | .................. | 327/534 |
| 6,058,041 A | 5/2000 | Golke et al. | ................. | 365/156 |
| 6,094,068 A | 7/2000 | Nomura et al. | ................ | 326/83 |
| 6,127,864 A | 10/2000 | Mavis et al. | .................. | 327/144 |
| 6,278,287 B1 | 8/2001 | Baze | .............................. | 326/9 |
| 6,326,809 B1 | 12/2001 | Gambles et al. | .............. | 326/46 |
| 6,327,176 B1 | 12/2001 | Li et al. | ....................... | 365/156 |
| 6,356,101 B1 | 3/2002 | Erstad | .......................... | 326/27 |
| 6,433,983 B1 | 8/2002 | Fechner | ....................... | 361/111 |
| 6,504,410 B2 * | 1/2003 | Waldie et al. | ............... | 327/199 |
| 6,753,694 B2 | 6/2004 | Eaton | ........................... | 326/13 |
| 6,794,908 B2 | 9/2004 | Erstad | ......................... | 327/112 |
| 7,023,235 B2 * | 4/2006 | Hoff | ............................... | 326/10 |
| 7,161,404 B2 * | 1/2007 | Hazucha et al. | ............. | 327/203 |
| 2002/0017924 A1 | 2/2002 | Knowles | ...................... | 326/119 |
| 2002/0175713 A1 | 11/2002 | Knowles | ...................... | 326/119 |

* cited by examiner

*Primary Examiner*—James H. Cho
(74) *Attorney, Agent, or Firm*—McDonnell Boehnen Hulbert & Berghoff LLP

(57) ABSTRACT

A decision block is incorporated into a circuit design to provide hardening against single event upset and to store data. The decision block includes a storage element that stores data as long as inputs to the decision block remain constant. The decision block receives a first data input and second data input from redundant logic blocks or from logic blocks designed to provide complementary outputs. The decision block provides an output that is at a same logic level as the first data input if the two data inputs are at expected logic levels during normal operating conditions (i.e., no disturbances). The decision block provides an output that is at a same logic level as a previous output of the decision block if the two data inputs are not at expected logic levels during normal operating conditions.

21 Claims, 6 Drawing Sheets

REDUNDANCY CIRCUITS HARDENED AGAINST SINGLE EVENT UPSETS

FIELD

The present invention relates generally to integrated circuit design, and more particularly, relates to redundancy circuits that are hardened against single event upsets.

BACKGROUND

Single Event Effects (SEE) are disturbances in an active semiconductor device caused by a single energetic particle. One type of SEE is a single event upset (SEU). SEU is a radiation-induced error in a semiconductor device caused when charged particles lose energy by ionizing the medium through which they pass, leaving behind a wake of electron-hole pairs, forming a parasitic conduction path. The parasitic conduction path causes a false transition on a node. The false transition, or glitch, propagates through the semiconductor device and ultimately results in the disturbance of a node containing state information, such as an output of a latch or register.

Typically, an SEU is caused by ionizing radiation components in the atmosphere, such as neutrons, protons, and heavy ions. The ionizing radiation components are abundant in space, even at commercial flight altitudes. Additionally, an SEU can be caused by alpha particles from the decay of trace concentrations of uranium and thorium present in some integrated circuit packaging. As another example, an SEU may be caused by detonating nuclear weapons. When a nuclear bomb is detonated, intense fluxes of gamma rays, x-rays, and other high energy particles are created.

Some semiconductor devices are designed to operate in conditions that expose the devices to energetic particles. These devices are typically modified to be hardened against SEE. For example, U.S. Pat. No. 6,753,694 describes obtaining SEU immunity by constructing a logic element with a redundant set of inputs and using two copies of each logic element to provide redundant outputs. When the redundant inputs agree, then the output of the logic element implements the logic function. However, when the redundant inputs disagree, then the output of the logic element is disconnected or tri-stated, which preserves the previous output value. U.S. Patent Application Serial. No. 2002/0175713 describes a similar method for hardening a device against SEE in which an output of the logic element is disconnected upon detection of an SEU. U.S. Pat. No. 6,753,694 and Patent Application Serial No. 2002/0175713 both rely on capacitance to store output data.

It would be beneficial to design a semiconductor device so that it can operate in conditions that expose the device to energetic particles and reliably store data. The present invention relies on a logical latching mechanism to store output data in addition to providing radiation hardness.

SUMMARY

A method and system for hardening circuits against SEU is described. The method includes providing a decision block that includes a storage element that stores data as long as a first input and a second input to the decision block remain constant. For example, the storage element may be a latch. If the first and second inputs are at the expected logic levels, the method includes providing an output from the decision block that has a same logic level as the first input. If the first input and the second input are not at the expected logic levels, then the method includes providing a previous output of the decision block. The method may also include clocking the first input and the second input into the decision block.

In one example, the first input is expected to be at a same logic level as the second input. In another example, the first input is expected to be at an opposite logic level as the second input. In yet another example, the second input is a delayed version of the first input.

A system for hardening circuits against SEU is also described. In one example, the system includes a first logic input, a second logic input designed to have a same logic level as the first logic input, and a decision block connected to the first logic input and the second logic input. The decision block includes a storage element that stores data as long as a first input and a second input to the decision block remain constant. For example, the storage element may be a latch.

The decision block provides a logic output. The logic output is the same as the first logic input if the first logic input and second logic input are at the same logic level. Alternatively, the logic output is a previous value of the logic output if the first logic input and the second logic input are at opposite logic levels.

In one example, the decision block includes two inverters and four NAND gates. The first logic input and the second logic input are connected to inputs of a first NAND gate and the two inverters. Outputs of the two inverters are connected to inputs of a second NAND gate. An output of the first NAND gate is connected to an input of the third NAND gate and an output of the second NAND gate is connected to an input of the fourth NAND gate. An output of the third NAND gate is connected to an input of the fourth NAND gate and an output of the fourth NAND gate is connected to an input of the third NAND gate. The output of the third NAND gate is the logic output.

In one example, the third and fourth NAND gates are hardened against single event upset. In another example, the first and second NAND gates are connected to a clock input. In another example, the decision block further includes four NAND gates connected to form a slave latch.

In another example, the system for hardening circuits against SEU includes a first logic input, a second logic input designed to have an opposite logic level as the first logic input, and a decision block connected to the first logic input and the second logic input. The decision block includes a storage element that stores data as long as a first input and a second input to the decision block remain constant.

The decision block provides a logic output. The logic output is the same as the first logic input if the first logic input and second logic input are at opposite logic levels. Alternatively, the logic output is a previous value of the logic output if the first logic input and the second logic input are at a same logic level.

In one example, the decision block includes two inverters and four NAND gates. The first logic input is connected to an input of a first inverter and an input of a first NAND gate, while the second logic input is connected to an input of a second inverter and an input of a second NAND gate. An output of the first inverter is connected to an input of the second NAND gate, while an output of the second inverter is connected to an input of the first NAND gate. An output of the first NAND gate is connected to an input of the third NAND gate and an output of the second NAND gate is connected to an input of the fourth NAND gate. An output of the third NAND gate is connected to an input of the fourth NAND gate and an output of the fourth NAND gate is connected to an input of the third NAND gate. The output of the third NAND gate is the logic output.

In one example, the third and fourth NAND gates are hardened against single event upset. In another example, the first and second NAND gates are connected to a clock input.

In another example, the decision block includes four inverters. The first logic input is connected to an input of a first inverter and the second logic input is connected to an input of a second inverter. An output of the first inverter is connected to an input of a third inverter and an output of a fourth inverter. An output of the second inverter is connected to an input of the fourth inverter and an output of the third inverter. The output of the third inverter is the logic output.

The third and fourth inverters have a first size and the first and second inverters have a second size. The first size is greater than the second size. A size difference between the first size and the second size prevents the logic output from changing to a different logic level if the first and second logic inputs are at the same logic level.

As the logic output of the decision block does not change unless the first logic input and the second logic input are at expected logic levels, the decision block acts as a glitch remover providing hardening against SEU. By incorporating the decision block into circuit designs, the circuit may be hardened against SEU. As a result, the circuit may be used in applications that expose the circuits to environments in which SEU may be an operational issue. Moreover, the decision block provides data storage, which may be important in many applications.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
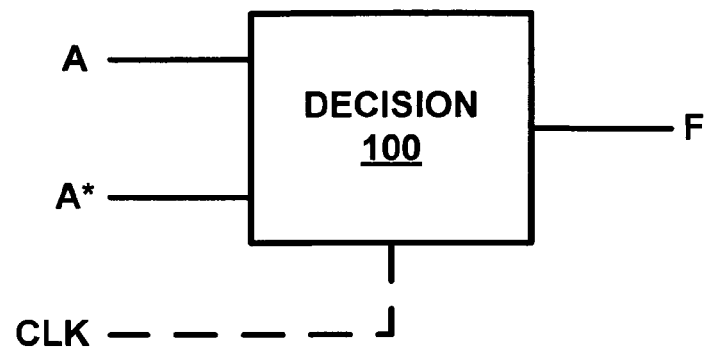
FIG. 1 is a block diagram of a decision block, according to an example.

FIG. 1 is a block diagram of a decision block 100. The decision block 100 is connected to two data inputs (A and A*). The two data inputs connected to the decision block 100 may be outputs of redundant logic blocks. Thus, the two data inputs to the decision block 100 may be at the same logic value (i.e., a logic-0 or a logic-1) during normal operating conditions (i.e., no disturbances). Alternatively, the two data inputs may be outputs of logic blocks designed to provide complementary outputs. Thus, the two data inputs connected to the decision block 100 may be at opposite logic values (i.e., one data input is at a logic-0 level when the other data input is at a logic-1 level) during normal operating conditions. As yet another example, the second data input A* may be a delayed version of the first data input A. The decision block 100 may also receive a clock input (CLK). The clock input is depicted in FIG. 1 with a dashed line as the decision block 100 may or may not be clocked.

The decision block 100 may provide an output (F). The decision block 100 functions to provide an output signal having the same logic value as the first data input A if the two data inputs A, A* are at the same logic level or the opposite logic level as expected during normal operating conditions. For example, if the two data inputs A, A* are connected to redundant logic blocks, the output F of the decision block 100 may provide an output signal having the same logic value as the first data input A if the two data inputs A, A* are at the same logic level. As another example, if the two data inputs A, A* are connected to logic blocks designed to provide complementary outputs, the output F of the decision block 100 may provide an output signal having the same logic value as the first data input A if the two data inputs are at opposite logic levels.

The decision block 100 functions to provide an output signal having the same logic value as the previous value of the output F if the two data inputs A, A* are not at logic levels expected during normal operating conditions. For example, if the two data inputs A, A* are expected to be at the same logic level but are at opposite logic levels, the output F of the decision block 100 is the previous value of the output F. Similarly, if the two data inputs A, A* are expected to be at opposite logic levels but are at the same logic level, the output F of the decision block 100 is the previous value of the output F. As the output F of the decision block 100 does not change unless the two data inputs A, A* are at expected logic levels, the decision block 100 acts as a glitch remover providing hardening against SEU.

In addition to filtering transients, the decision block 100 also functions to store output data. The decision block includes a storage element for storing the output data. In contrast to relying on capacitance to store the output data, the decision block relies on a logical latching mechanism to store the output data. The logical latching mechanism stores the output data as long as inputs to the decision block 100 remain constant. As a result, the decision block 100 has a dual purpose and can be used in circuit designs needing both SEU hardness and data storage. While logical latching mechanism examples are described with respect to FIGS. 2, 6, and 8-10, other latching designs may be used in the decision block 100.

Figure 2:
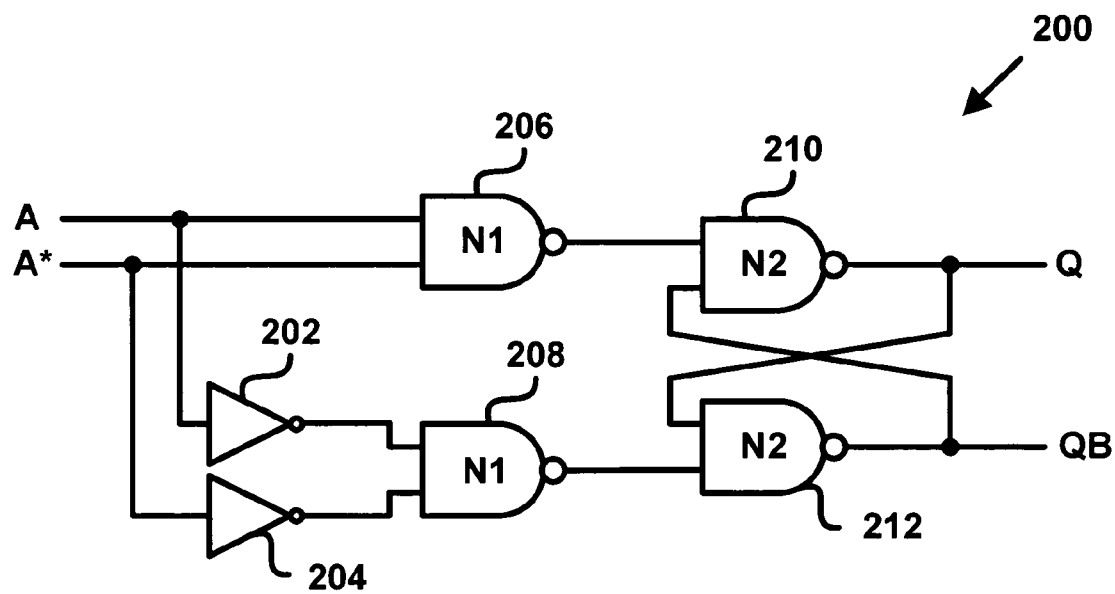
FIG. 2 is a circuit diagram of a logic circuit that may be used in the decision block depicted in FIG. 1, according to an example.

FIG. 2 is a circuit diagram of a logic circuit 200 that may be used in the decision block 100 depicted in FIG. 1. The logic circuit 200 receives two data inputs A, A* that are designed to be at the same logic level during normal operations (i.e., no disturbances). The logic circuit 200 includes two inverters 202, 204 and four NAND gates 206-212. The N1 NAND gates 206, 208 may not be hardened against SEU, while the N2 NAND gates 210, 212 may be hardened against SEU. The difference between the N1 NAND gates 206, 208 and the N2 NAND gates 210, 212 are further described with reference to FIGS. 3, 4, and 5.

The two data inputs A, A* are connected to inputs of the first N1 NAND gate 206. The first data input A is also connected to an input of the first inverter 202, while the second data input A* is also connected to an input of the second inverter 204. Outputs of the first and second inverters 202, 204 are connected to inputs of the second N1 NAND gate 208.

An output of the first N1 NAND gate 206 is connected to an input of the first N2 NAND gate 210. An output of the second N1 NAND gate 208 is connected to an input of the second N2 NAND gate 212. An output Q of the first N2 NAND gate 210 is connected to an input of the second N2 NAND gate 212. An output QB of the second N2 NAND gate 212 is connected to an input of the first N2 NAND gate 210. These feedback connections from the outputs Q, QB to the inputs of the N2 NAND gates 210, 212 form a latch. As a result, the logic circuit 200 provides data storage.

The output Q of the first N2 NAND gate 210 is substantially the same as the output F of the decision block 100 depicted in FIG. 1. The output QB of the second N2 NAND gate 212 is a complementary output having a logic value that is opposite to that of the output Q of the first N2 NAND gate 210. While the complementary output QB is not depicted in FIG. 1, this output may be provided as an output of the decision block 100.

For the following description of the operation of the logic circuit 200, assume that both data inputs A, A* to the logic circuit 200 are at a logic-1 level. In this example, the output of the first N1 NAND gate 206 is at a logic-0 level, while the output of the second N1 NAND gate 208 is at a logic-1 level. Further, the output of the first N2 NAND gate 210 is at a logic-1 level, while the output of the second N2 NAND gate 212 is at a logic-0 level. As described, during normal operation of the logic circuit 200, the output Q of the first N2 NAND gate 210 has the same logic level as the first data input A to the logic circuit 200 (i.e., a logic-1).

If an SEU occurs producing a glitch on the first data input A, the logic level of the first data input A may transition from a logic-1 to a logic-0. As a result of this glitch, the output of the first N1 NAND gate may transition from a logic-0 level to a logic-1 level. Additionally, the output of the first inverter 202 may transition from a logic-0 level to a logic-i level. However, these changes to the outputs of the first N1 NAND gate 206 and the first inverter 202 do not impact the state of the outputs of the second N1 NAND gate 208, the first N2 NAND gate 210, and the second N2 NAND gate 212. As a result, the output Q of the first N2 NAND gate 210 has the same logic level as the previous output of the first N2 NAND gate 210 prior to the SEU (i.e., a logic-1).

Figure 3A:
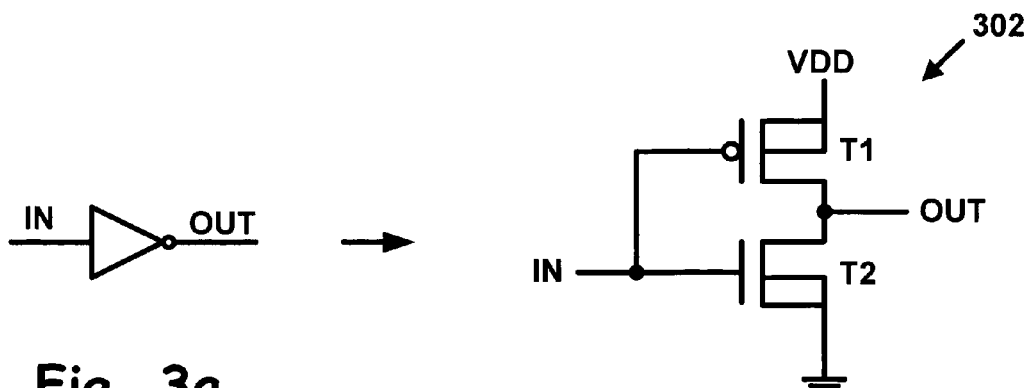
FIG. 3 is a circuit diagram showing a transistor layout of logic gates used in the logic circuit depicted in FIG. 2, according to an example.

FIG. 3 is a schematic diagram showing a transistor layout of the logic gates used in the logic circuit 200 depicted in FIG. 2. In FIG. 3a, a transistor layout 302 of the inverters 202, 204 is depicted. The transistor layout 302 is a typical transistor layout for an inverter. The transistor layout 302 includes two transistors, a p-type transistor T1 and an n-type transistor T2. The two transistors T1 and T2 are depicted in FIG. 3 as CMOS transistors; however, other transistor types may be used.

The input (IN) to the inverter is connected to the gates of both the T1 and T2 transistors. The drain and the body of the T1 transistor are connected to the power source VDD. The source and the body of the T2 transistor are connected to ground. The source of T1 transistor and the drain of the T2 transistor are connected together to form the output (OUT) of the inverter. When a logic-0 is applied to the inverter input, T1 is turned on and T2 is turned off, resulting in a logic-1 output of the inverter. When a logic-1 is applied to the inverter input, T1 is turned off and T2 is turned on, resulting in a logic-0 output of the inverter.

Figure 3B:
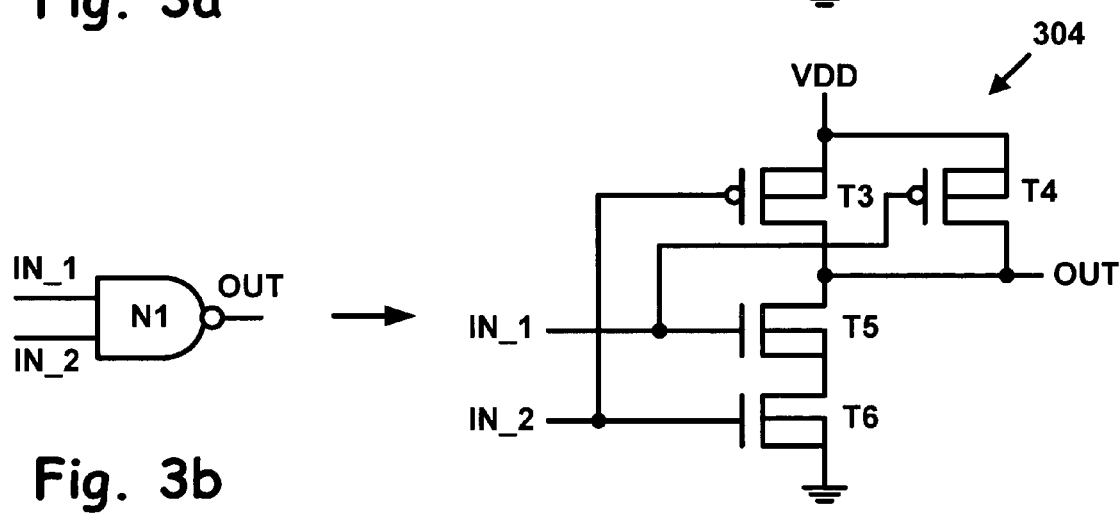

In FIG. 3b, a transistor layout 304 of the N1 NAND gates 206, 208 is depicted. The transistor layout 304 is a typical transistor layout for a NAND gate. The transistor layout 304 includes four transistors: two p-type transistors T3, T4 in a pull-up network and two n-type transistors T5, T6 in a pull-down network. The transistors T3, T4, T5, and T6 are depicted in FIG. 3 as CMOS transistors; however, other transistor types may be used.

The first input (IN_1) to the N1 NAND gate is connected to the gates of both the T4 and T5 transistors. The second input (IN_2) to the N1 NAND gate is connected to the gates of both the T3 and T6 transistors. The drain and the body of the T3 and T4 transistors are connected to the power source VDD. The source and the body of the T6 transistor are connected to ground. The source of T3 transistor, the source of the T4 transistor, and the drain of the T5 transistor are connected together to form the output (OUT) of the N1 NAND gate. The source and the body of the T5 transistor are connected to the drain of the T6 transistor.

When the first and second inputs to the N1 NAND gate are both at a logic-0 level, the T3 and T4 transistors are turned on, while the T5 and T6 transistors are turned off. As a result, the output of the N1 NAND gate is pulled to a logic-1 level via the T3 and T4 transistors. When the first and second inputs to the N1 NAND gate are at a logic-0 level and a logic-1 level, respectively, the T4 and T6 transistors are turned on, while the T3 and T5 transistors are turned off. As a result, the output of the N1 NAND gate is pulled to a logic-1 level via the T4 transistor. When the first and second inputs to the N1 NAND gate are at a logic-1 level and a logic-0 level, respectively, the T3 and T5 transistors are turned on, while the T4 and T6 transistors are turned off. As a result, the output of the N1 NAND gate is pulled to a logic-1 level via the T3 transistor. When the first and second inputs to the N1 NAND gate are both at a logic-1 level, the T5 and T6 transistors are turned on, while the T3 and T4 transistors are turned off. As a result, the output of the N1 NAND gate is pulled to a logic-0 level via the T5 and T6 transistors.

Figure 3C:
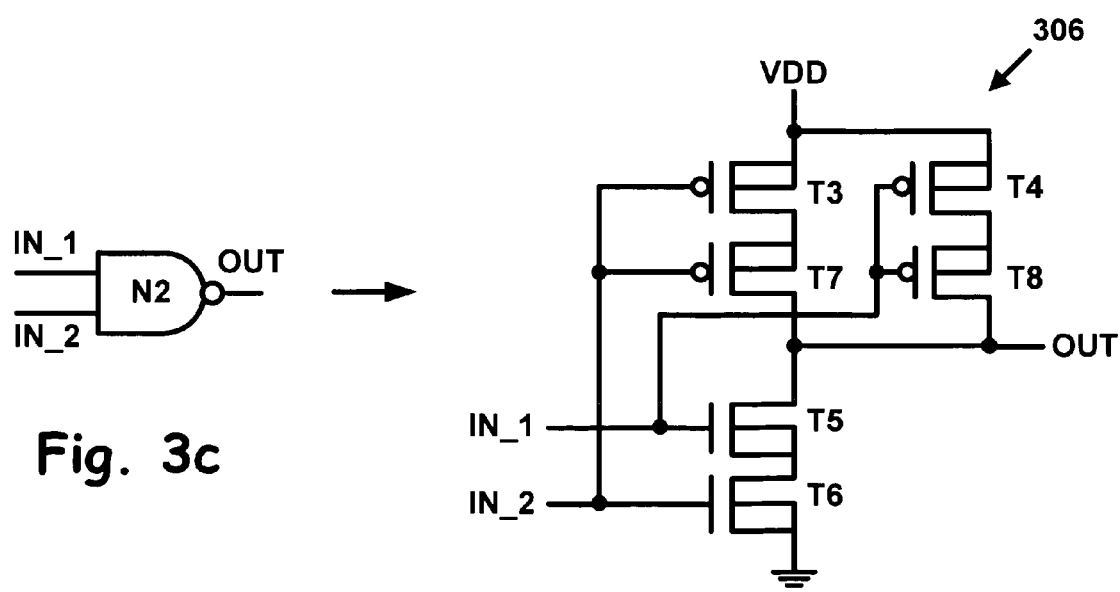

In FIG. 3c, a transistor layout 306 of the N2 NAND gates 210, 212 is depicted. The transistor layout 306 shows a hardened transistor layout for a NAND gate. The transistor layout 306 is similar to the transistor layout 304; however, two additional transistors, T7 and T8, are added to the design to harden the NAND gate against SEU. The transistor layout 306 includes six transistors: four p-type transistors T3, T4, T7, T8 in a pull-up network and two n-type transistors T5, T6 in a pull-down network. The transistors T3, T4, T5, T6, T7, and T8 are depicted in FIG. 3 as CMOS transistors; however, other transistor types may be used.

The first input (IN_1) to the N2 NAND gate is connected to the gates of the T4, T8, and T5 transistors. The second input (IN_2) to the N2 NAND gate is connected to the gates of the T3, T7, and T6 transistors. The drain and the body of the T3 and T4 transistors are connected to the power source VDD. The source and the body of the T6 transistor are connected to ground. The source of the T3 transistor is connected to the drain and the body of the T7 transistor, while the source of the T4 transistor is connected to the drain and the body of the T8 transistor. The source of T7 transistor, the source of the T8 transistor, and the drain of the T5 transistor are connected together to form the output (OUT) of the N2 NAND gate. The source and the body of the T5 transistor are connected to the drain of the T6 transistor.

The N2 NAND gate operates substantially the same as the N1 NAND gate, as described with reference to FIG. 3b, during normal operating conditions (i.e., no disturbances). However, the addition of the redundant T7 and T8 transistors harden the N2 NAND gate against SEU. For example, if the first input to the N2 NAND gate is at a logic-1 and the second input to the N2 NAND gate is at a logic-0, an ion strike on the T6 transistor may cause the T6 transistor to erroneously turn on, creating a pull-down path to ground. However, the pull-up path to VDD holds the output of the N2 NAND gate at a logic-1 level as a result of the redundant pull-up transistors T7, T8.

As described above, the N1 NAND gates 206, 208 may not be hardened against SEU, while the N2 NAND gates 210, 212 may be hardened against SEU. As described with respect to FIGS. 4 and 5, hardening of an N1 NAND gate is not necessary as an ion strike on a transistor in the N1 NAND gate may not impact the output F of the decision block 100.

Figure 4:
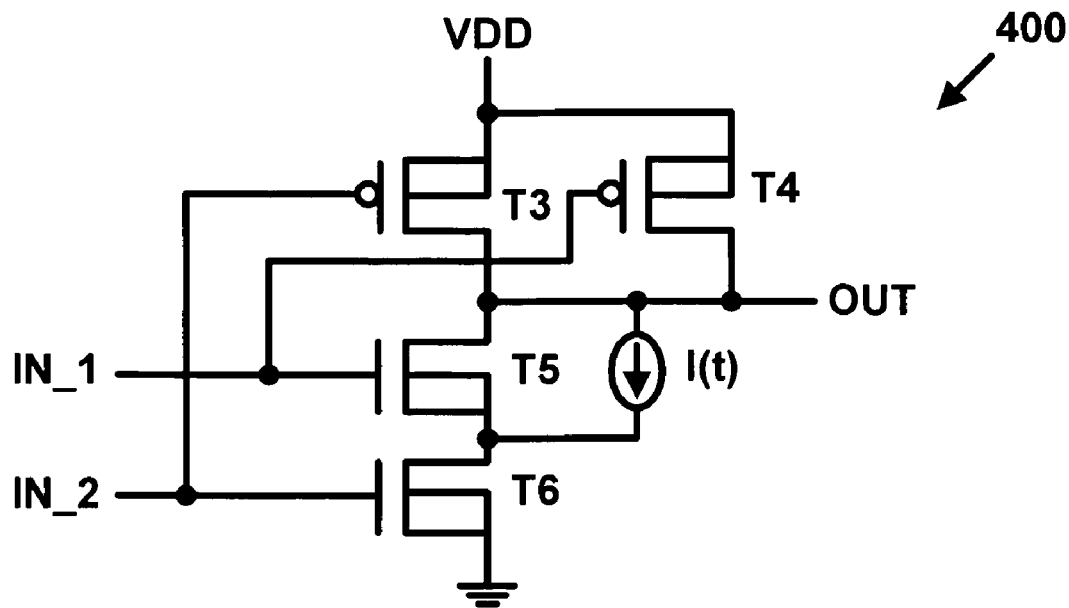
FIG. 4 is a circuit diagram showing an effect of an ion strike on a first transistor of an N1 NAND gate depicted in FIG. 2, according to an example.

FIG. 4 is a circuit diagram 400 showing an effect of an ion strike on an n-type transistor in the N1 NAND gate 206, 208 depicted in FIGS. 2 and 3b. The circuit diagram 400 is substantially the same as the transistor layout 304 depicted in FIG. 3b. The circuit diagram 400 also depicts the effect of an ion strike (symbolized as I(t)) on the T5 transistor. An ion strike on the T5 transistor (or the T6 transistor) results in the transistor erroneously turning on.

During normal operating conditions (i.e., no ion strike), the first and second inputs to the N1 NAND gate are at the same logic level, either a logic-0 level or a logic-1 level. If the first and second inputs to the N1 NAND gate are at a logic-0 level, the output of the N1 NAND gate remains at a logic-1 level if either of the pull-down transistors T5, T6 are hit with an ion strike. If the T5 transistor erroneously turns on, the T6 transistor prevents current from flowing to ground. Similarly, if the T6 transistor erroneously turns on, the T5 transistor prevents current from flowing to ground. As a result, the output of the N1 NAND gate is not impacted by an ion strike on the T5 or T6 transistors.

Figure 5:
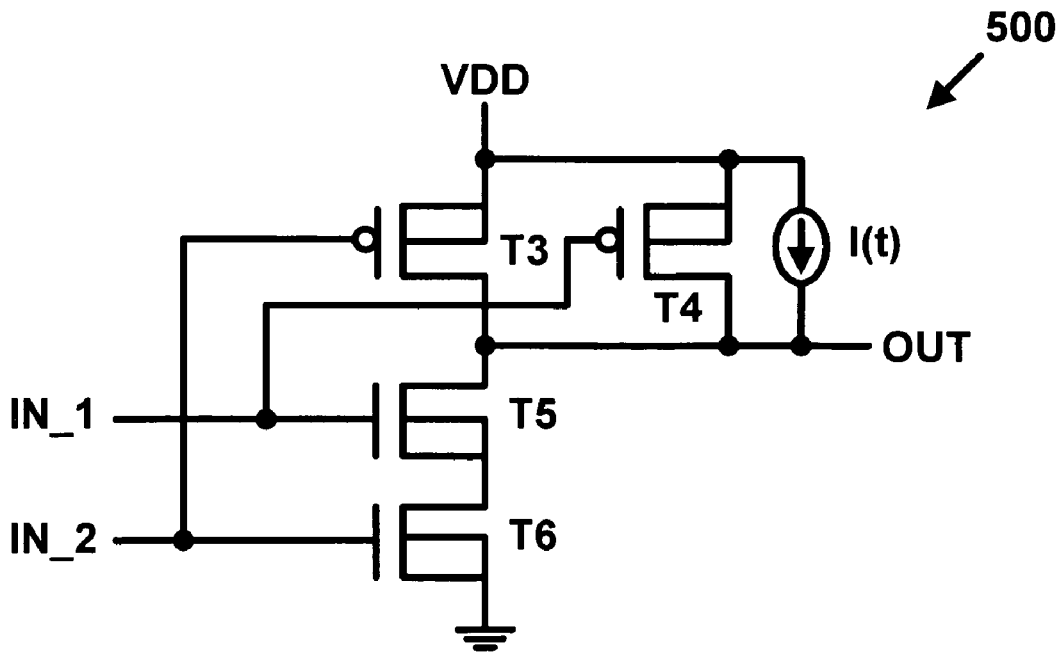
FIG. 5 is a circuit diagram showing an effect of an ion strike on a second transistor of the N1 NAND gate depicted in FIG. 2, according to an example.

FIG. 5 is a circuit diagram 500 showing an effect of an ion strike on a p-type transistor in the N1 NAND gate 206, 208 depicted in FIGS. 2 and 3b. The circuit diagram 500 is substantially the same as the transistor layout 304 depicted in FIG. 3b. The circuit diagram 500 also depicts the effect of an ion strike (symbolized as I(t)) on the T4 transistor. An ion strike on the T4 transistor (or the T3 transistor) results in the transistor erroneously turning on. If the T4 transistor turns on, the output of the N1 NAND gate may erroneously transition from a logic-0 level to a logic-1 level. However, this transition does not affect the output F of the decision block 100 as described with reference to FIG. 2.

Figure 6:
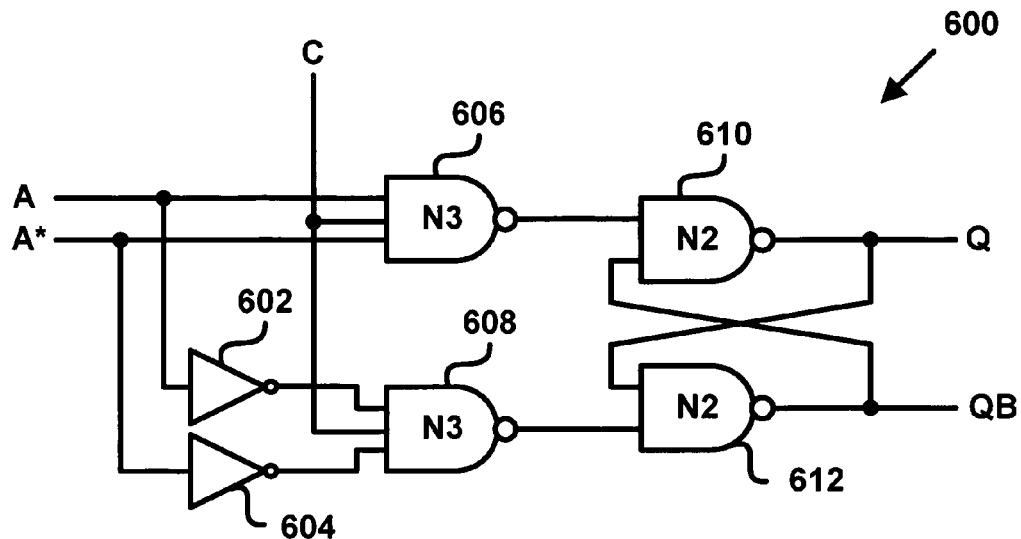
FIG. 6 is a circuit diagram of a logic circuit that may be used in the decision block depicted in FIG. 1, according to another example.

FIG. 6 is a circuit diagram of another logic circuit 600 that may be used in the decision block 100 depicted in FIG. 1.

The logic circuit 600 is substantially the same as the logic circuit 200; however, the logic circuit 600 has a clock input C. As a result, the output Q of the logic circuit 600 is clocked.

The logic circuit 600 includes two inverters 602, 604 and four NAND gates 606-612. The N3 NAND gates 606, 608 may not be hardened against SEU, while the N2 NAND gates 610, 612 may be hardened against SEU. The N2 NAND gates 610, 612 are substantially the same as the N2 NAND gates 210, 212 depicted in FIG. 2. The N3 NAND gates 606, 608 are similar to the N1 NAND gates 206, 208 depicted in FIG. 2, except that the N3 NAND gates have three inputs instead of two. The N3 NAND gates 606, 608 are further described with reference to FIG. 7.

The two data inputs A, A* are connected to inputs of the first N3 NAND gate 606. The first data input A is also connected to an input of the first inverter 602, while the second data input A* is also connected to an input of the second inverter 604. Outputs of the first and second inverters 602, 604 are connected to inputs of the second N3 NAND gate 608. The clock input C is connected to an input of each of the first and second N3 NAND gates 606, 608.

An output of the first N3 NAND gate 606 is connected to an input of the first N2 NAND gate 610. An output of the second N3 NAND gate 608 is connected to an input of the second N2 NAND gate 612. An output Q of the first N2 NAND gate 610 is connected to an input of the second N2 NAND gate 612. An output QB of the second N2 NAND gate 612 is connected to an input of the first N2 NAND gate 610. These feedback connections from the outputs Q, QB to the inputs of the N2 NAND gates 610, 612 form a latch. As a result, the logic circuit 600 provides data storage.

The output Q of the first N2 NAND gate 610 is substantially the same as the output F of the decision block 100 depicted in FIG. 1. The output QB of the second N2 NAND gate 612 is a complementary output having a logic value that is the opposite logic value as the output Q of the first N2 NAND gate 610. While the complementary output is not depicted in FIG. 1, this output may be provided as an output of the decision block 100.

The operation of the logic circuit 600 is similar to the operation of the logic circuit 200, except the output of the N3 NAND gates 606, 608 remains at a logic-1 level, unless the two inputs to the N3 NAND gate are at a logic-1 level and the clock input C transitions from a logic-0 level to a logic-1 level. For the following description of the operation of the logic circuit 600, assume that both data inputs A, A* to the logic circuit 600 are at a logic-1 level and that the clock input C has transitioned from a logic-0 level to a logic-1 level. In this example, the output of the first N3 NAND gate 606 is at a logic-0 level, while the output of the second N3 NAND gate 608 is at a logic-1 level. Further, the output of the first N2 NAND gate 610 is at a logic-1 level, while the output of the second N2 NAND gate 612 is at a logic-0 level. As described, during normal operation of the logic circuit 600, the output Q of the first N2 NAND gate 610 has the same logic level as the first data input A to the logic circuit 600 (i.e, a logic-1).

If an SEU occurs producing a glitch on the first data input A, the logic level of the first data input A may transition from a logic-1 to a logic-0. The clock signal C may latch the glitch to the output of the first N3 NAND gate 606. As a result, the output of the first N3 NAND gate 606 may transition from a logic-0 level to a logic-1 level. Additionally, the output of the first inverter 602 may transition from a logic-0 level to a logic-1 level. However, these changes to the outputs of the first N3 NAND gate 606 and the first inverter 602 do not impact the outputs of the second N3 NAND gate 608, the first N2 NAND gate 610, and the second N2 NAND gate 612. As a result, the output Q of the first N2 NAND gate 610 has the same logic level as the previous output of the first N2 NAND gate 610 prior to the SEU (i.e., a logic-1).

Figure 7:
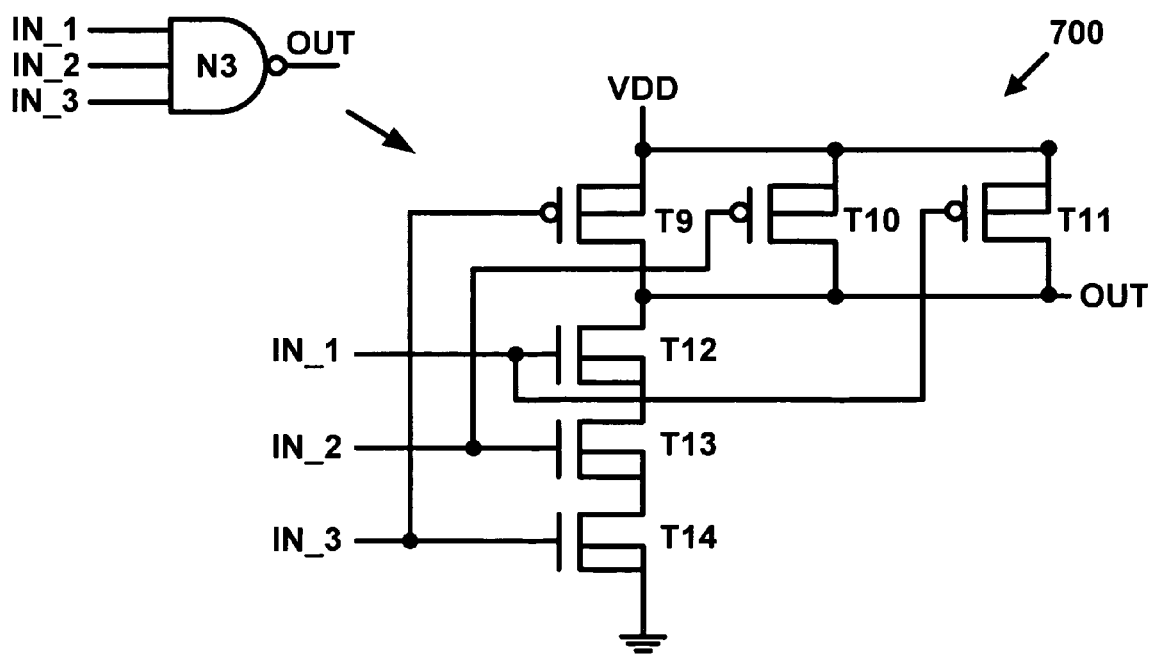
FIG. 7 is a circuit diagram showing a transistor layout of one of the logic gates used in the logic circuit depicted in FIG. 6, according to an example.

FIG. 7 is a circuit diagram showing a transistor layout 700 of the N3 NAND gates 606, 608 used in the logic circuit 600 depicted in FIG. 6. The transistor layout 700 is a typical transistor layout for a three-input NAND gate. The transistor layout 700 includes six transistors: three p-type transistors T9, T10, T11 in a pull-up network and three n-type transistors T12, T13, T14 in a pull-down network. The transistors T9-T14 are depicted in FIG. 7 as CMOS transistors; however, other transistor types may be used.

The first input (IN_i) to the N3 NAND gate is connected to the gates of both the T11 and T12 transistors. The second input (IN_2) to the N3 NAND gate is connected to the gates of both the T10 and T13 transistors. The third input (IN_3) to the N3 NAND gate is connected to the gates of both the T9 and T14 transistors. The order in which the first, second, and third inputs of the N3 NAND gate are connected to the two data inputs A, A* and the clock input C does not matter.

The drain and the body of the T9, T10, and T11 transistors are connected to the power source VDD. The source and the body of the T14 transistor are connected to ground. The source of T9 transistor, the source of the T10 transistor, the source of the T11 transistor, and the drain of the T12 transistor are connected together to form the output (OUT) of the N3 NAND gate. The source and the body of the T12 transistor are connected to the drain of the T13 transistor. The source and the body of the T13 transistor are connected to the drain of the T14 transistor.

When any of the transistors in the pull-up network (T9, T10, and T11) are turned on (i.e., a gate of the pull-up transistor is connected to an input at a logic-0 level), the output of the N3 NAND gate is pulled to a logic-1 level (i.e., connected to VCC). When any of the transistors in the pull-down network (T12, T13, and T14) are turned off (i.e., a gate of the pull-down transistor is connected to an input at a logic-0 level), the output of the N3 NAND gate is not pulled (i.e., connected) to ground. Thus, when any of the inputs to the N3 NAND gate are at a logic-0 level, the output of the N3 NAND gate is at a logic-1 level. If all of the inputs to the N3 NAND gate are at a logic-1 level, the output of the N3 NAND gate is at a logic-0 level.

Figure 8:
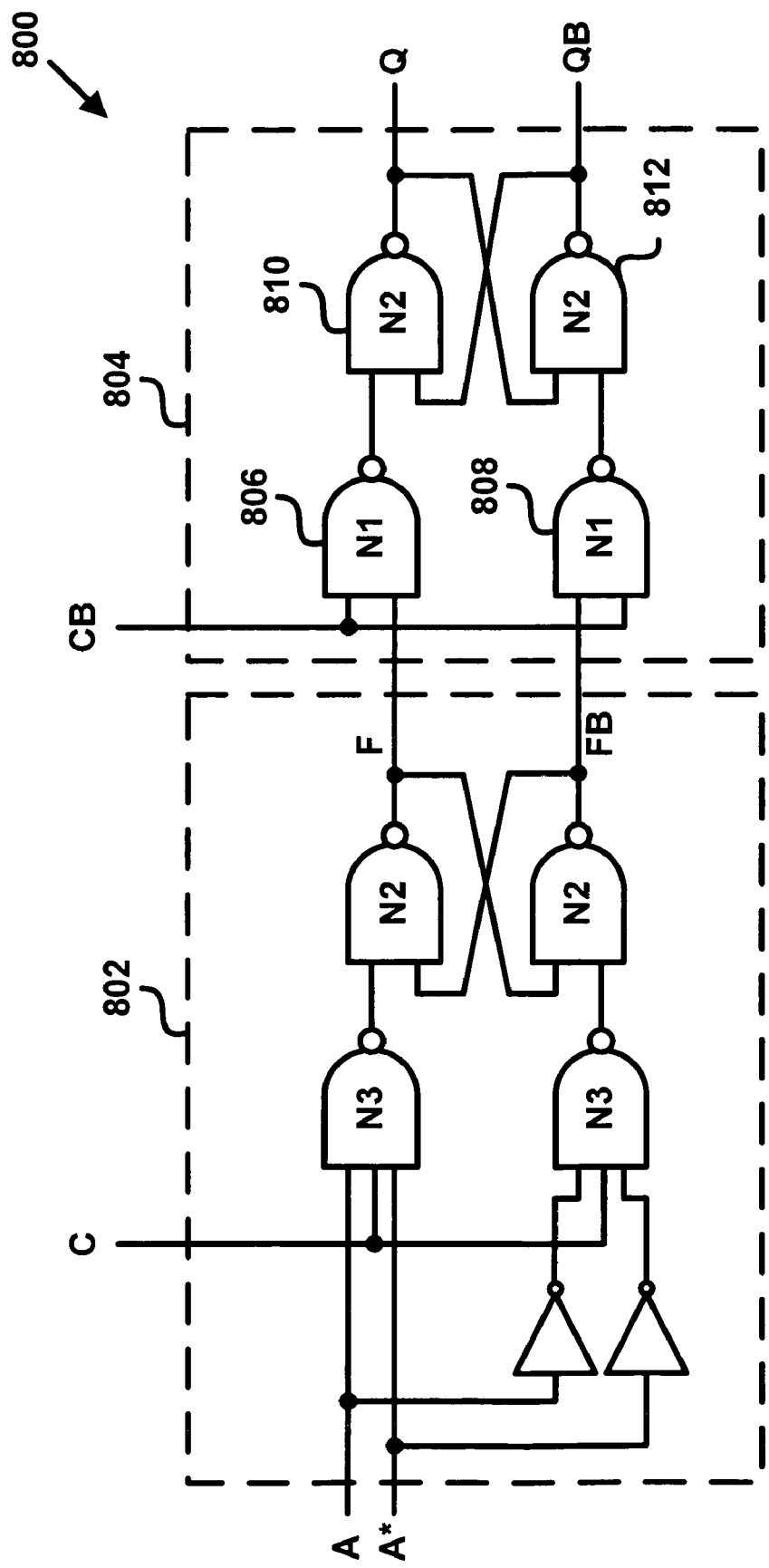
FIG. 8 is a circuit diagram of a logic circuit that may be used in the decision block depicted in FIG. 1, according to another example.

FIG. 8 is a circuit diagram of another logic circuit 800 that can be used in the decision block 100 depicted in FIG. 1. The logic circuit 800 includes a master latch 802 and a slave latch 804. The master latch 802 is substantially the same as the logic circuit 600 depicted in FIG. 6. The slave latch 804 includes two N1 NAND gates 806, 808, and two N2 NAND gates 810, 812.

The output F of the master latch 802 is connected to an input of the first N1 NAND gate 806. The complementary output FB of the master latch 802 is connected to an input of the second N1 NAND gate 808. A complementary clock signal CB is connected to an input of both the first and second N1 NAND gates 806, 808. An output of the first N1 NAND gate 806 is connected to an input of the first N2 NAND gate 810. An output of the second N1 NAND gate 808 is connected to an input of the second N2 NAND gate 812. An output Q of the first N2 NAND gate 810 is connected to an input of the second N2 NAND gate 812. An output QB of the second N2 NAND gate 812 is connected to an input of the first N2 NAND gate 810. These feedback connections from the outputs Q, QB to the inputs of the N2 NAND gates 810, 812 form a latch. As a result, the slave latch 804 provides data storage.

The output F of the master latch 802 has the same logic level as the first data input A if the two data inputs A, A* have the same logic level. The output F of the master latch 802 has the same logic level as the previous output of the master latch 802 if the two data inputs A, A* have different logic levels. The output Q of the slave latch 804 is a delayed version of the output F of the master latch 802. When the clock input to the logic circuit 800 transitions from a logic-0 to a logic-1 level, the master latch 802 output F changes based on the logic levels of the data inputs A, A*, while the slave latch 804 output Q retains the previous state of the output F. When the clock input to the logic circuit 800 transitions from a logic-1 to a logic-0 level, the output F of the master latch 802 does not change based on changes to the data inputs A, A*, but the slave latch 804 output Q changes to the logic level of the F output. In addition to the hardness described with reference to FIG. 6, the logic circuit 800 may provide additional hardness against SEU due to the delay of transferring the output F of the master latch 802 to the output Q of the slave latch 804.

Figure 9:
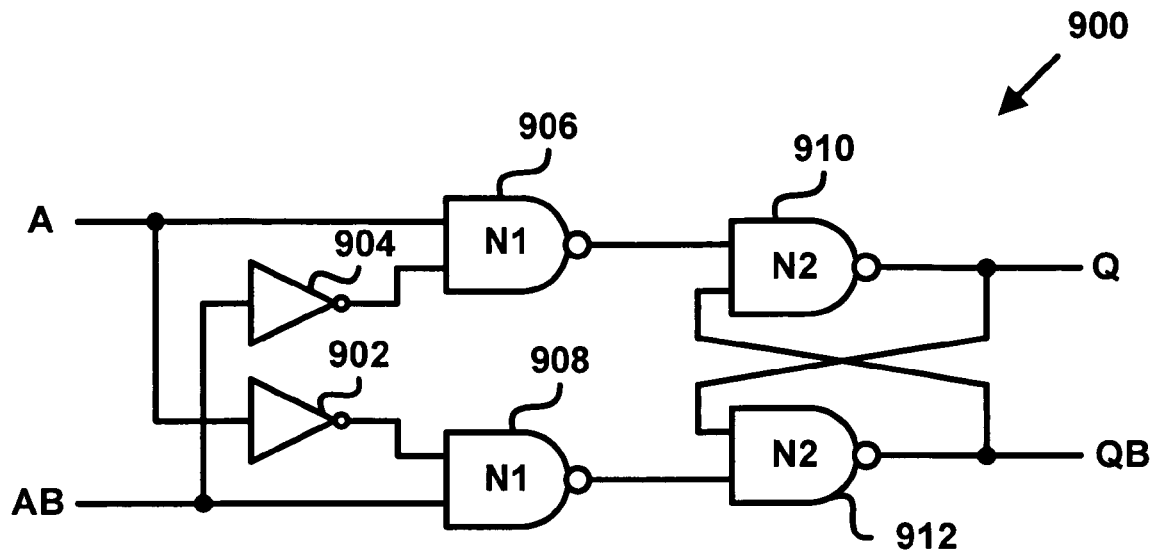
FIG. 9 is a circuit diagram of a logic circuit that may be used in the decision block depicted in FIG. 1, according to another example.

FIG. 9 is a circuit diagram of another logic circuit 900 that can be used in the decision block 100 depicted in FIG. 1. The logic circuit 900 is designed to operate with complementary inputs A and AB. The two inputs A and AB have the opposite logic values (i.e., one data input is at a logic-0 level when the other is at a logic-1 level) during normal operating conditions (i.e., no disturbances). For example, the two inputs A and AB may be connected to outputs of logic blocks designed to provide complementary outputs.

The logic circuit 900 includes two inverters 902, 904 and four NAND gates 906-912. The N1 NAND gates 906, 908 may not be hardened against SEU, while the N2 NAND gates 910, 912 may be hardened against SEU. The first data input A is connected to an input of the first inverter 902 and an input of the first N1 NAND gate 906. The second data input AB is connected to an input of the second inverter 904 and an input of the second N1 NAND gate 908.

An output of the first inverter 902 is connected to an input of the second N1 NAND gate 908. An output of the second inverter 904 is connected to an input of the first N1 NAND gate 906. An output of the first N1 NAND gate 906 is connected to an input of the first N2 NAND gate 910. An output of the second N1 NAND gate 908 is connected to an input of the second N2 NAND gate 912. An output Q of the first N2 NAND gate 910 is connected to an input of the second N2 NAND gate 912. An output QB of the second N2 NAND gate 912 is connected to an input of the first N2 NAND gate 910. These feedback connections from the outputs Q, QB to the inputs of the N2 NAND gates 910, 912 form a latch. As a result, the logic circuit 900 provides data storage.

The output Q of the first N2 NAND gate 910 is substantially the same as the output of the decision block 100 depicted in FIG. 1. The output QB of the second N2 NAND gate 912 is a complementary output having a logic value that is the opposite logic value as the output of the first N2 NAND gate 910. While the complementary output QB is not depicted in FIG. 1, this output may be provided as an output of the decision block 100.

For the following description of the operation of the logic circuit 900, assume that the first data input A to the logic circuit 900 is at a logic-1 level and the second data input AB is at a logic-0 level. In this example, the output of the first N1 NAND gate 906 is at a logic-0 level, while the output of the second N1 NAND gate 908 is at a logic-1 level. Further, the output of the first N2 NAND gate 910 is at a logic-1 level, while the output of the second N2 NAND gate 912 is at a logic-0 level. During normal operation of the logic circuit 900, the output Q of the first N2 NAND gate 910 has the same logic level as the first data input A to the logic circuit 900 (i.e., a logic-1).

If an SEU occurs producing a glitch on the first data input A, the logic level of the first data input A may transition from a logic-1 to a logic-0. As a result of this glitch, the output of the first N1 NAND gate 906 may transition from a logic-0 level to a logic-1 level. Additionally, the output of the first inverter 902 may transition from a logic-0 level to a logic-1 level. However, these changes to the outputs of the first N1 NAND gate 906 and the first inverter 902 do not impact the outputs of the second N1 NAND gate 908, the first N2 NAND gate 910, and the second N2 NAND gate 912. As a result, the output Q of the first N2 NAND gate 910 has the same logic level as the previous output of the first N2 NAND gate 910 prior to the SEU (i.e., a logic-1).

Figure 10:
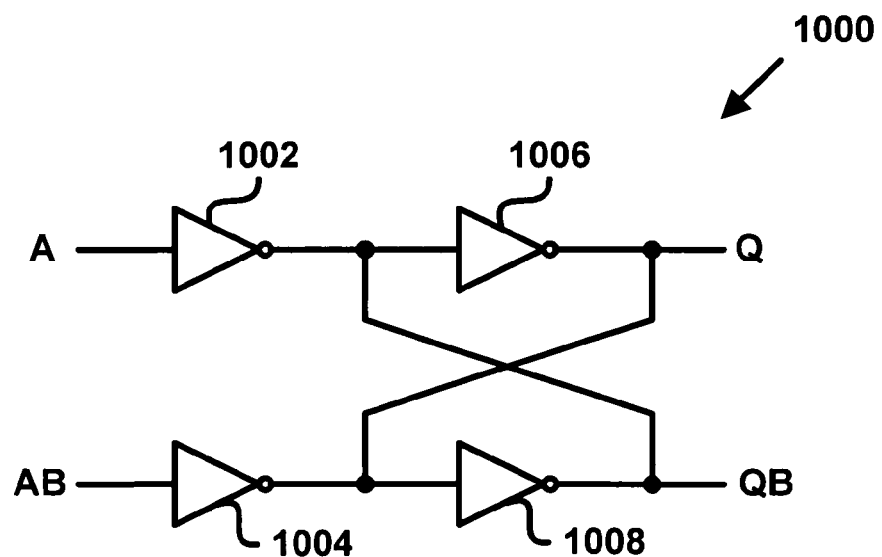
FIG. 10 is a circuit diagram of a logic circuit that may be used in the decision block depicted in FIG. 1, according to another example.

FIG. 10 is a circuit diagram of another logic circuit 1000 that can be used in the decision block 100 depicted in FIG. 1. The logic circuit 1000, which may be referred to as a "sticky" latch, uses current contention to harden against SEU. The logic circuit 1000 is designed to operate with complementary inputs A and AB. The two inputs A and AB have the opposite logic values (i.e., one data input is at a logic-0 level when the other is at a logic-1 level) during normal operating conditions (i.e., no disturbances). For example, the two inputs A and AB may be connected to outputs of logic blocks designed to provide complementary outputs.

The logic circuit 1000 includes four inverters 1002-1008. The first and second inverters 1002, 1004 (referred to as the input inverters) are composed of transistors that are smaller than the transistors in the third and fourth inverters 1006, 1008 (referred to as the output inverters). The size difference is designed so that both input inverters 1002, 1004 are needed to change the state of the output inverters 1006, 1008. For example, the output inverters 1006, 1008 may be twice as large as the input inverters 1002, 1004.

The first data input A is connected to an input of the first inverter 1002. The second data input AB is connected to an input of the second inverter 1004. An output of the first inverter 1002 is connected to an input of the third inverter 1006 and an output QB of the fourth inverter 1008. An output of the second inverter 1004 is connected to an input of the fourth inverter 1008 and an output Q of the third inverter 1006. The feedback connections from the outputs Q, QB to the inputs of the third and fourth inverters 1006, 1008 form a latch. As a result, the logic circuit 1000 provides data storage.

The output Q of the third inverter 1006 is substantially the same as the output F of the decision block 100 depicted in FIG. 1. The output QB of the fourth inverter 1008 is a complementary output having a logic value that is the opposite logic value as the output of the third inverter 1006. While the complementary output QB is not depicted in FIG. 1, this output may be provided as an output of the decision block 100.

During an SEU, one of data inputs A, AB may transition to an erroneous state, resulting in both data inputs A, AB being at the same logic level. However, the current flow generated by the SEU in one of the input inverters 1002, 1004 is not large enough to cause a transition at the output of the output inverters 1006, 1008. The feedback from the output inverters 1006, 1008 keeps the inputs to the output inverters 1006, 1008 at their previous states. Thus, the logic circuit 1000 is hardened against SEU.

A variety of logic circuits that can be used in the decision block 100 have been described as non-limiting examples. Other logic circuits may also be used to provide the dual purpose functionality of the decision block 100. By incorporating the decision block 100 into circuit designs, the circuit may be hardened against SEU. As a result, these circuits may be used in applications that expose the circuits to radiation, such as aerospace applications. These circuits may also be used in applications requiring data storage. Because the decision block 100 provides both radiation hardness and data storage, the number of devices in a circuit design may be reduced.

It should be understood that the illustrated embodiments are examples only and should not be taken as limiting the scope of the present invention. For example, the decision block may be used in circuits that may be disturbed for reasons other than SEU. The claims should not be read as limited to the described order or elements unless stated to that effect. Therefore, all embodiments that come within the scope and spirit of the following claims and equivalents thereto are claimed as the invention.

I claim:

1. A method for hardening circuits against single event upsets, comprising in combination:
   providing a decision block that includes a storage element that stores data as long as a first input and a second input to the decision block remain constant;
   providing an output from the decision block having a same logic level as the first input if the first input and the second input are at expected logic levels; and
   providing a previous output of the decision block if the first input and the second input are not at the expected logic levels.

2. The method of claim 1, wherein the first input is expected to be at a same logic level as the second input.

3. The method of claim 1, wherein the first input is expected to be at an opposite logic level as the second input.

4. The method of claim 1, wherein the second input is a delayed version of the first input.

5. The method of claim 1, further comprising clocking the first input and the second input into the decision block.

6. The method of claim 1, further comprising providing a complementary output from the decision block.

7. The method of claim 1, wherein the storage element is a latch.

8. A system for hardening circuits against single effect upsets, comprising in combination:
   a first logic input;
   a second logic input designed to have a same logic level as the first logic input; and
   a decision block connected to the first logic input and the second logic input, wherein the decision block includes a storage element that stores data as long as a first input and a second input to the decision block remain constant, wherein the decision block provides a logic output, wherein the logic output is the same as the first logic input if the first logic input and second logic input are at a same logic level, and wherein the logic output is a previous value of the logic output if the first logic input and the second logic input are at opposite logic levels.

9. The system of claim 8, wherein the decision block includes two inverters and four NAND gates, wherein the first logic input and the second logic input are connected to inputs of a first NAND gate and the two inverters, wherein outputs of the two inverters are connected to inputs of a second NAND gate, wherein an output of the first NAND gate is connected to an input of the third NAND gate and an output of the second NAND gate is connected to an input of the fourth NAND gate, wherein an output of the third NAND gate is connected to an input of the fourth NAND gate and an output of the fourth NAND gate is connected to an input of the third NAND gate, and wherein the output of the third NAND gate is the logic output.

10. The system of claim 9, wherein the third and fourth NAND gates are hardened against single event upset.

11. The system of claim 9, wherein the first and second NAND gates are connected to a clock input.

12. The system of claim 11, wherein the decision block further includes four NAND gates connected to form a slave latch.

13. The system of claim 8, wherein the decision block further provides a complementary logic output.

14. A system for hardening circuits against single event upsets, comprising in combination:
   a first logic input;
   a second logic input designed to have an opposite logic level as the first logic input; and
   a decision block connected to the first logic input and the second logic input, wherein the decision block includes a storage element that stores data as long as a first input and a second input to the decision block remain constant, wherein the decision block provides a logic output, wherein the logic output is the same as the first logic input if the first logic input and second logic input are at opposite logic levels, and wherein the logic output is a previous value of the logic output if the first logic input and the second logic input are at a same logic level.

15. The system of claim 14, wherein the decision block includes two inverters and four NAND gates, wherein the first logic input is connected to an input of a first inverter and an input of a first NAND gate, wherein the second logic input is connected to an input of a second inverter and an input of a second NAND gate, wherein an output of the first inverter is connected to an input of the second NAND gate and an output of the second inverter is connected to an input of the first NAND gate, wherein an output of the first NAND gate is connected to an input of the third NAND gate and an output of the second NAND gate is connected to an input of the fourth NAND gate, wherein an output of the third NAND gate is connected to an input of the fourth NAND gate and an output of the fourth NAND gate is connected to an input of the third NAND gate, and wherein the output of the third NAND gate is the logic output.

16. The system of claim 15, wherein the third and fourth NAND gates are hardened against single event upset.

17. The system of claim 15, wherein the first and second NAND gates are connected to a clock input.

18. The system of claim 14, wherein the decision block includes four inverters, wherein the first logic input is connected to an input of a first inverter and the second logic input is connected to an input of a second inverter, wherein an output of the first inverter is connected to an input of a third inverter and an output of a fourth inverter, wherein an output of the second inverter is connected to an input of the fourth inverter and an output of the third inverter, and wherein the output of the third inverter is the logic output.

19. The system of claim 18, wherein the third and fourth inverters have a first size and the first and second inverters have a second size, wherein the first size is greater than the second size.

20. The system of claim 19, wherein a size difference between the first size and the second size prevents the logic output from changing to a different logic level if the first and second logic inputs are at the same logic level.

21. The system of claim 14, wherein the decision block further provides a complementary logic output.

* * * * *